(12) United States Patent
Zhang et al.

(10) Patent No.: US 7,718,506 B2
(45) Date of Patent: May 18, 2010

(54) ISOLATION STRUCTURE FOR MOS TRANSISTOR AND METHOD FOR FORMING THE SAME

(75) Inventors: Buxin Zhang, Shanghai (CN); Yuan Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 281 days.

(21) Appl. No.: 11/951,072

(22) Filed: Dec. 5, 2007

(65) Prior Publication Data

US 2008/0230843 A1 Sep. 25, 2008

(30) Foreign Application Priority Data

Mar. 22, 2007 (CN) .......................... 2007 1 0038451

(51) Int. Cl.
*H01L 21/76* (2006.01)
(52) U.S. Cl. .............................. 438/440; 257/E21.556
(58) Field of Classification Search ................ 438/440; 257/E21.556
See application file for complete search history.

(56) References Cited

U.S. PATENT DOCUMENTS

| 6,127,242 | A  | * | 10/2000 | Batra et al. .................. 438/440 |
| 6,258,693 | B1 | * | 7/2001  | Choi ........................... 438/423 |
| 6,593,637 | B1 |   | 7/2003  | Ibok |
| 6,939,814 | B2 | * | 9/2005  | Chan et al. ................... 438/778 |
| 7,052,964 | B2 | * | 5/2006  | Yeo et al. .................... 438/296 |
| 7,405,436 | B2 | * | 7/2008  | Chidambarrao et al. ..... 257/204 |
| 2003/0186511 | A1 |   | 10/2003 | Yiu |

FOREIGN PATENT DOCUMENTS

CN           1877839 A       12/2006

OTHER PUBLICATIONS

Chinese Office Action of related application mailed Jun. 19, 2009, 4 pgs. without translation.

* cited by examiner

*Primary Examiner*—Trung Dang
(74) *Attorney, Agent, or Firm*—Squire, Sanders & Dempsey, L.L.P.

(57) ABSTRACT

A method for forming isolation structure for MOS transistor is disclosed, which includes forming a first photoresist layer over a sacrificed oxide layer of a semiconductor substrate, patterning the first photoresist layer to define a PMOS active region and a PMOS isolation region; implanting nitrogen ions into the PMOS isolation region through the sacrificed oxide layer by using the first photoresist layer as a mask; removing the first photoresist layer; forming a second photoresist layer over the sacrificed oxide layer, patterning the second photoresist layer to define a NMOS active region and a NMOS isolation region; implanting oxygen ions into the NMOS isolation region through the sacrificed oxide layer by using the second photoresist layer as a mask; removing the second photoresist layer and the sacrificed oxide layer; and annealing the semiconductor substrate to form isolation structures of PMOS and NMOS, respectively.

12 Claims, 6 Drawing Sheets

ISOLATION STRUCTURE FOR MOS TRANSISTOR AND METHOD FOR FORMING THE SAME

This application claims the priority of Chinese patent application No. 200710038451.4, filed on Mar. 22, 2007, the entire disclosure of which is incorporated herein by reference.

FIELD OF THE INVENTION

The present invention relates to a semiconductor device and a method for forming the same, and more particularly, to an isolation structure for MOS transistor and a method for forming the same.

DESCRIPTION OF THE RELATED ART

Metal-oxide semiconductor (MOS) transistor is one of the most important electronic components in the current integrated circuit. Typically, an integrated circuit is composed of a plurality of MOS transistors. In order to prevent a short-circuit phenomenon occurring between these adjacent MOS transistors, it is necessary to incorporate an isolation structure for electrical isolation between the adjacent MOS transistors.

Since the size of MOS transistor is continuously decreased due to the increasing integration level for the semiconductor device, the isolation structure between the MOS transistors is also decreased. Therefore, in the deep-submicron process, a shallow trench (STI) is used as the isolation structure between the MOS transistors.

The Chinese patent application No. CN 01143945.9 discloses a method for forming a MOS transistor comprising a shallow trench isolation structure. As shown in FIG. 1, a pad oxide layer 102 is formed over a semiconductor substrate 100 by using an oxidation process or a chemical vapor deposition (CVD) process for protecting the semiconductor substrate 100 during a subsequent exposure process; a first photoresist layer 104 is formed over the pad oxide layer 102 by a spin coating process, and a photoresist open 105 whose position corresponds to a subsequent shallow trench is formed by an exposure and developing process and so on. As shown in FIG. 2, a shallow trench 106 is formed by etching the pad oxide layer 102 and the semiconductor substrate 100 along the photoresist open 105 with using the first photoresist layer 104 as a mask. As shown in FIG. 3, the first photoresist layer 104 is removed by an ashing process and a liner oxide layer 108 is formed in the shallow trench 106 by a thermal-oxidation process to prevent the material subsequently filled in the shallow trench from permeating into the semiconductor substrate 100; an insulator layer 110 is formed over the pad oxide layer 102 by a CVD process and the shallow trench 106 is filled with the insulator layer 110, the insulator layer 110 is made of silicon oxide or silicon oxynitride. As shown in FIG. 4, the insulator layer 110 is polished by a chemical-mechanical polishing (CMP) process until the pad oxide layer 102 is exposed, thereby forming a shallow trench isolation structure 112 for isolating the adjacent active regions 111; the pad oxide layer 102 is removed by a wet etching process.

As shown in FIG. 5, n-type ions are doped into one active region 111 adjacent to the shallow trench isolation structure 112 to form a n-well 113 and define a PMOS active region 114. p-type ions are doped into the other active region 111 adjacent to the shallow trench isolation structure 112 to form a p-well 115 and define a NMOS active region 116. A gate dielectric layer 118 is then formed over the PMOS active region 114 and the NMOS active region 116 by an oxidation process. A polysilicon layer 120 is formed over the gate dielectric layer 118 by a CVD process. The polysilicon layer 120 and the gate dielectric layer 118 are etched until the semiconductor substrate 100 is exposed, thereby forming gates 120a and 120b on the PMOS active region 114 and the NMOS active region 116 respectively. p-type ions are implanted into the semiconductor substrate 100 on both sides of the gate 120a in the PMOS active region 114 to form a p-type low-doped drain 122, and n-type ions are implanted into the semiconductor substrate 100 on both sides of the gate 120b in the NMOS active region 116 to form a n-type low-doped drain 123. Spacers 124a and 124b are formed on sidewalls of the gates 120a and 120b respectively, to form gate structures 125a and 125b. p-type ions are implanted into the semiconductor substrate 100 on both sides of the gate structure 125a in the PMOS active region 114 to form a p-type source/drain 126, and n-type ions are implanted into the semiconductor substrate 100 on both sides of the gate structure 125b in the NMOS active region 116 to form a n-type source/drain 128.

In the conventional process for forming a shallow trench isolation structure for MOS transistor, since the size of the shallow trench can not be well-controlled due to the poor directivity of etching gas or etching liquor during the etching process, the product yield is lowered. In addition, in order to prevent the material filled subsequently in the shallow trench from permeating into the semiconductor substrate, a liner oxide layer is formed on sidewalls of the shallow trench by an oxidation process. During the oxidation process, the semiconductor substrate adjacent to the shallow trench may expand, so that a tensile stress which is disadvantageous to the hole transfer may be occurred in the adjacent PMOS active regions and a compressive stress which is disadvantageous to the electron transfer may be occurred in the adjacent NMOS active regions. Therefore it will cause the circuit in the MOS transistor not to operate normally.

SUMMARY OF THE INVENTION

The object of the present invention is to provide an isolation structure for MOS transistor and a method for forming the same, in order to control the size of the isolation structure, and control the stress within the PMOS and NMOS active regions, and thereby improve the electrical properties of PMOS and NMOS.

In the first aspect according to the present invention, there is provided a method for forming an isolation structure for MOS transistor, which comprises the following steps: forming a sacrificed oxide layer over a semiconductor substrate; forming a first photoresist layer over the sacrificed oxide layer, and patterning the first photoresist layer to define a PMOS active region and a PMOS isolation region on the semiconductor substrate; implanting nitrogen ions into the PMOS isolation region through the sacrificed oxide layer by using the first photoresist layer as a mask; removing the first photoresist layer; forming a second photoresist layer over the sacrificed oxide layer, and patterning the second photoresist layer to define a NMOS active region and a NMOS isolation region on the semiconductor substrate; implanting oxygen ions into the NMOS isolation region through the sacrificed oxide layer by using the second photoresist layer as a mask; removing the second photoresist layer and the sacrificed oxide layer; and annealing the semiconductor substrate to form isolation structures of PMOS and NMOS, respectively.

As the NMOS active region and the NMOS isolation region are defined, the NMOS isolation region and adjacent PMOS isolation region partially overlap between each other to form a buffer isolation region; and as the isolation structures of PMOS and NMOS are formed, a buffer isolation structure is formed.

The partially overlapped region between the NMOS isolation region and the PMOS isolation region has a cross-section area along the width direction of the active region of 0%~30% relate to the total cross-section area of the NMOS and PMOS isolation regions along the width direction of the active region.

The implanting energy of nitrogen ions is in a range of 50 KeV~400 KeV, and the implantation dose of nitrogen ions is in a range of $10^{15}/cm^3 \sim 10^{22}/cm^3$.

The implanting energy of oxygen ions is in a range of 50 KeV~400 KeV, and the implantation dose of oxygen ions is in a range of $10^{15}/cm^3 \sim 10^{22}/cm^3$.

The annealing is performed under a temperature of 700° C.~1300° C. for 60 min~210 min.

In the second aspect according to the present invention, there is provided a method for forming an isolation structure for MOS transistor, which comprises the following steps: forming a sacrificed oxide layer over a semiconductor substrate; forming a first photoresist layer over the sacrificed oxide layer, and patterning the first photoresist layer to define a NMOS active region and a NMOS isolation region on the semiconductor substrate; implanting oxygen ions into the NMOS isolation region through the sacrificed oxide layer by using the first photoresist layer as a mask; removing the first photoresist layer; forming a second photoresist layer over the sacrificed oxide layer, and patterning the second photoresist layer to define a PMOS active region and a PMOS isolation region on the semiconductor substrate; implanting nitrogen ions into the PMOS isolation region through the sacrificed oxide layer by using the second photoresist layer as a mask; removing the second photoresist layer and the sacrificed oxide layer; and annealing the semiconductor substrate to form isolation structures of PMOS and NMOS, respectively.

As the PMOS active region and the PMOS isolation region are defined, the NMOS isolation region and adjacent PMOS isolation region partially overlap between each other to form a buffer isolation region; and as the isolation structures of PMOS and NMOS are formed, a buffer isolation structure is formed.

The partially overlapped region between the NMOS isolation region and the PMOS isolation region has a cross-section area along the width direction of the active region of 0%~30% relate to the total cross-section area of the NMOS and PMOS isolation regions along the width direction of the active region.

In the third aspect according to the present invention, there is provided an isolation structure for MOS transistor, which comprises a semiconductor substrate; a PMOS active region and a NMOS active region in the semiconductor substrate; a PMOS isolation region between the PMOS active regions; and a NMOS isolation region between the NMOS active regions, wherein nitrogen ions are contained in the PMOS isolation region and oxygen ions are contained in the NMOS isolation region.

The isolation structure for MOS transistor further comprises a buffer isolation region formed by partially overlapping between the NMOS isolation region and adjacent PMOS isolation region.

The partially overlapped region between the NMOS isolation region and the PMOS isolation region has a cross-section area along the width direction of the active region of 0%~30% relate to the total cross-section area of the NMOS and PMOS isolation regions along the width direction of the active region.

The implanting energy of nitrogen ions is in a range of 50 KeV~400 KeV, and the implantation dose of nitrogen ions is in a range of $10^{15}/cm^3 \sim 10^{22}/cm^3$.

The implanting energy of oxygen ions is in a range of 50 KeV~400 KeV, and the implantation dose of oxygen ions is in a range of $10^{15}/cm^3 \sim 10^{22}/cm^3$.

In comparison with the previous techniques, the present invention is advantageous in that (1) the PMOS isolation structure is formed by implanting nitrogen ions into the PMOS isolation region and the NMOS isolation structure is formed by implanting oxygen ions into the NMOS isolation region, and thus the isolation structure is formed only by ions implantation, which simplifies the process procedure;

(2) a tensile stress is generated in the PMOS isolation structure formed by implanting nitrogen ions into the PMOS isolation region due to the difference between silicon nitride (SiN) and silicon (Si) in physical properties, which causes a compressive stress in the PMOS active region, and further facilitates the migration of hole, thereby achieving the improvement of the electrical properties of PMOS; a tensile stress is generated in the NMOS active region due to the difference between silicon oxide and Si in physical properties when a NMOS isolation structure is formed by implanting oxygen ions into the NMOS isolation region, which facilitates the migration of electron, thereby achieving the improvement of the electrical properties of NMOS.

(3) the NMOS and PMOS isolation regions partially overlap between each other to form a buffer isolation region, and thus a part of the buffer isolation region contacting with the PMOS active region has a tensile stress, which causes a compressive stress in the PMOS active region, and the part of the buffer isolation region having the compressive stress can not effect the PMOS active region, so that a tensile stress is not generated in the PMOS active region and the compressive stress in the PMOS active region is not weakened; a part of the buffer isolation region contacting with the NMOS active region has a compressive stress, which causes a tensile stress in the NMOS active region, and the part of the buffer isolation region having the tensile stress can not effect the NMOS active region, so that a compressive stress is not generated in the NMOS active region and the tensile stress in the NMOS active region is not weakened; and (4) the depth and critical size of the formed isolation structure can be effectively controlled by controlling the energy and dose of the implanted nitrogen and oxygen ions and the annealing temperature and annealing time, so that the isolation performance of the isolation structure can be controlled readily and thereby the electrical property of the corresponding MOS device can be enhanced.

DESCRIPTION OF SPECIFIC EMBODIMENTS

In the present invention, (1) the PMOS isolation structure is formed by implanting nitrogen ions into the PMOS isolation region and the NMOS isolation structure is formed by implanting oxygen ions into the NMOS isolation region, and thus the isolation structure is formed only by ions implantation, which simplifies the process procedure; (2) a tensile stress is generated in the PMOS isolation structure formed by implanting nitrogen ions into the PMOS isolation region due to the difference between silicon nitride (SiN) and silicon (Si) in physical properties, which causes a compressive stress in the PMOS active region, and further facilitates the migration of hole, thereby achieving the improvement of the electrical properties of PMOS; a tensile stress is generated in the NMOS active region due to the difference between silicon oxide and Si in physical properties when a NMOS isolation structure is formed by implanting oxygen ions into the NMOS isolation region, which facilitates the migration of electron, thereby achieving the improvement of the electrical properties of NMOS; (3) the NMOS and PMOS isolation regions partially overlap between each other to form a buffer isolation region, and thus a part of the buffer isolation region contacting with the PMOS active region has a tensile stress, which causes a compressive stress in the PMOS active region, and the part of the buffer isolation region having the compressive stress can not effect the PMOS active region, so that a tensile stress is not generated in the PMOS active region and the compressive stress in the PMOS active region is not weakened; a part of the buffer isolation region contacting with the NMOS active region has a compressive stress, which causes a tensile stress in the NMOS active region, and the part of the buffer isolation region having the tensile stress can not effect the NMOS active region, so that a compressive stress is not generated in the NMOS active region and the tensile stress in the NMOS active region is not weakened; and (4) the depth and critical size of the formed isolation structure can be effectively controlled by controlling the energy and dose of the implanted nitrogen and oxygen ions and the annealing temperature and annealing time, so that the isolation performance of the isolation structure can be controlled readily and thereby the electrical property of the corresponding MOS device can be enhanced.

The embodiments of the present invention will be described in detail below in conjunction with the accompanying drawings.

The isolation structure for MOS transistor provided in the present invention comprises a semiconductor substrate; a PMOS active region and a NMOS active region in the semiconductor substrate; a PMOS isolation region between the PMOS active regions; and a NMOS isolation region between the NMOS active regions, wherein nitrogen ions are contained in the PMOS isolation region and oxygen ions are contained in the NMOS isolation region.

Figure 1:
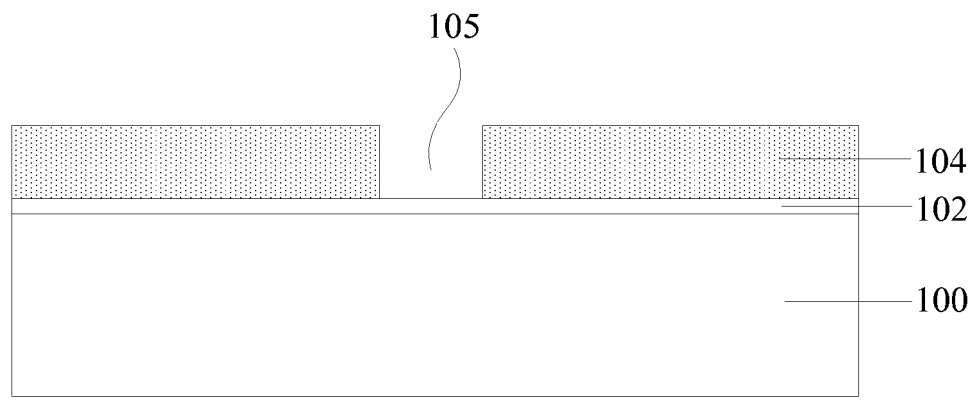
FIGS. 1 to 5 illustrate schematic views of a conventional method for forming a MOS transistor comprising a shallow trench isolation structure.
Figure 2:
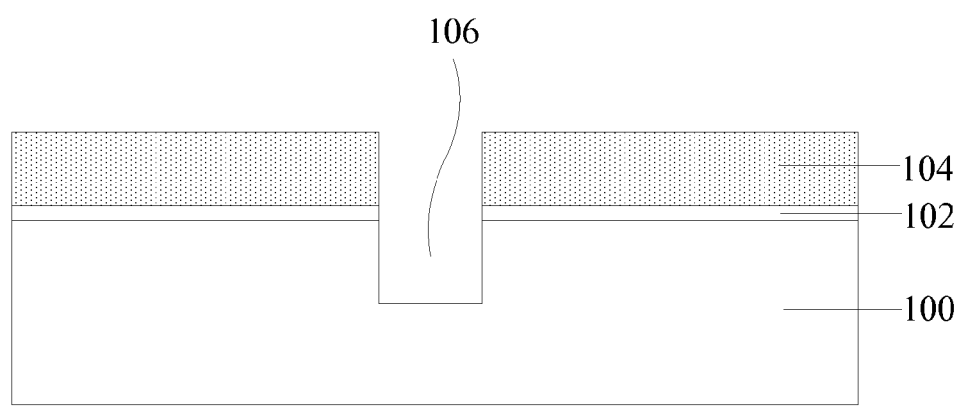
Figure 3:
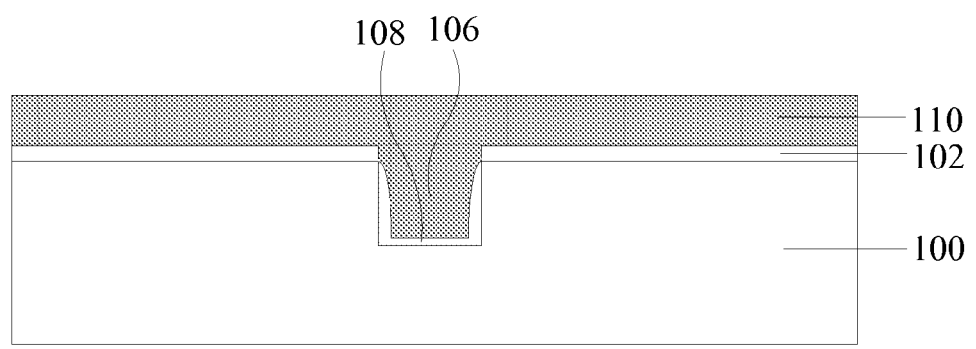
Figure 4:
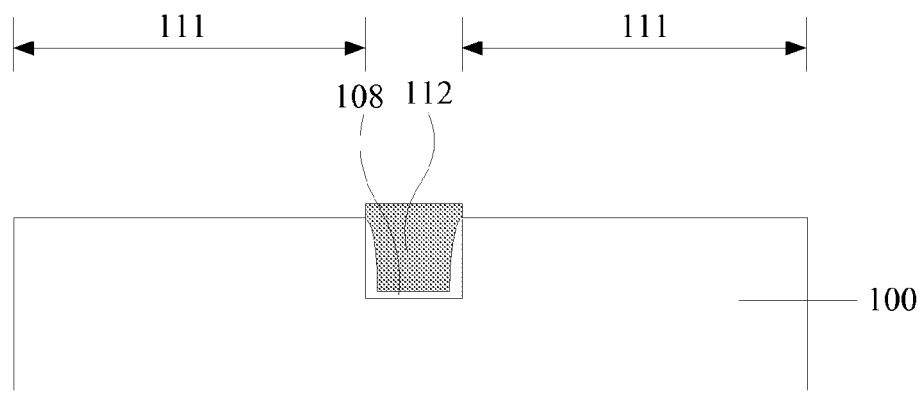
Figure 5:
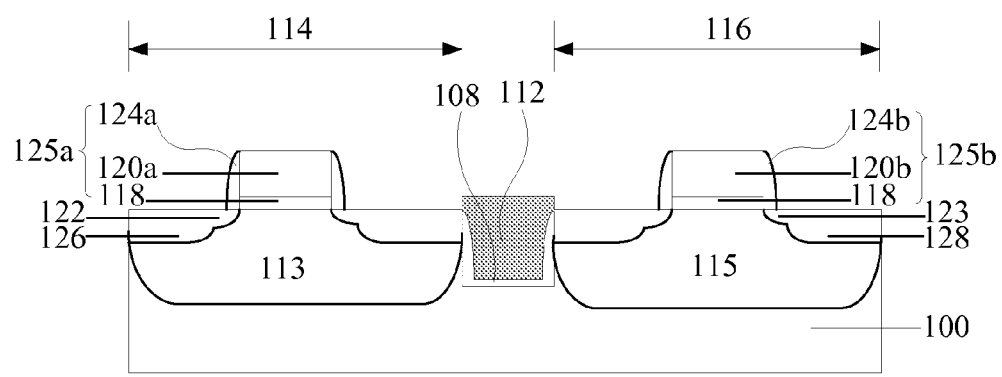
Figure 6:
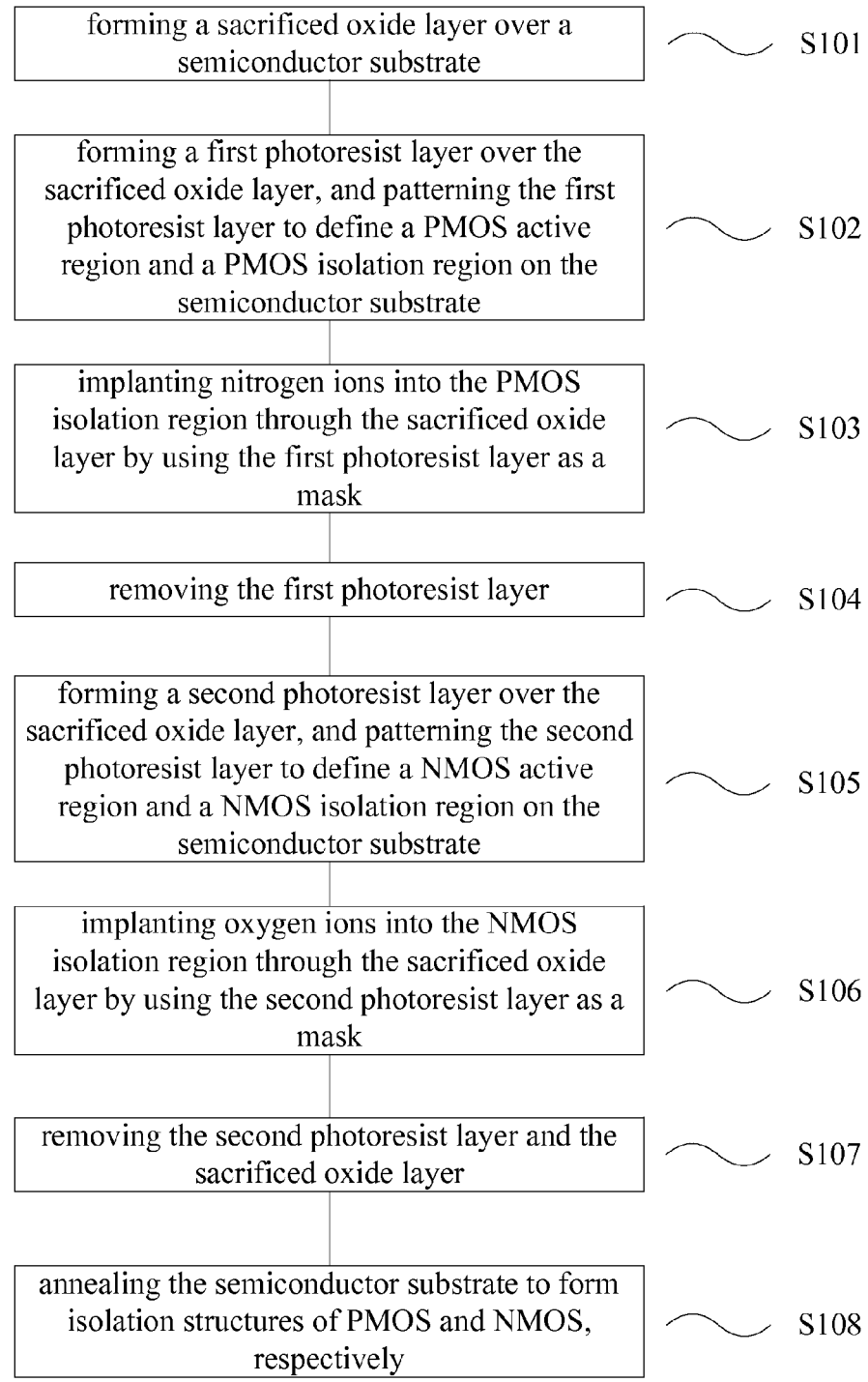
FIG. 6 is a flow chart illustrating a method for forming an isolation structure for MOS transistor according to a first embodiment of the present invention.

FIG. 6 is a flow chart illustrating a method for forming an isolation structure for MOS transistor according to a first embodiment of the present invention. As shown in FIG. 6, a step S101 is performed to form a sacrificed oxide layer over a semiconductor substrate.

The function of the sacrificed oxide layer is to protect the semiconductor substrate during the subsequent developing treatment. Preferably, the sacrificed oxide layer is made of silicon oxide generally formed by a thermal oxidation process, and which also can be made of silicon oxynitride generally formed by a low pressure chemical vapor deposition process or plasma-assisted chemical vapor deposition process.

A step S102 is performed to form a first photoresist layer over the sacrificed oxide layer, and pattern the first photoresist layer so as to define a PMOS active region and a PMOS isolation region on the semiconductor substrate.

The first photoresist layer is formed over the sacrificed oxide layer by a spin coating process, and then the pattern on the mask is transferred onto the first photoresist layer by the known exposure and developing treatment, and the first photoresist layer is patterned.

A step S103 is performed to implant nitrogen ions into the PMOS isolation region through the sacrificed oxide layer by using the first photoresist layer as a mask.

The nitrogen ions implanted into the PMOS isolation region are used to react with the semiconductor substrate to produce silicon nitride. The implantation energy of nitrogen ions is 50 KeV~400 KeV, and the implantation dose of nitrogen ions is $10^{15}/cm^3 \sim 10^{22}/cm^3$.

A step S104 is performed to remove the first photoresist layer.

The first photoresist layer is removed by a known ashing process.

A step S105 is performed to form a second photoresist layer over the sacrificed oxide layer, and pattern the second photoresist layer so as to define a NMOS active region and a NMOS isolation region on the semiconductor substrate.

The second photoresist layer is formed over the sacrificed oxide layer by a spin coating process, and then the pattern on the mask is transferred onto the second photoresist layer by the known exposure and developing treatment, and the second photoresist layer is patterned.

As the NMOS active region and the NMOS isolation region are defined, the NMOS isolation region and adjacent PMOS isolation region partially overlap between each other to form a buffer isolation region. The partially overlapped region between the NMOS isolation region and the PMOS isolation region has a cross-section area along the width direction of the active region of 0%~30% relate to the total cross-section area of the NMOS and PMOS isolation regions along the width direction of the active region.

A step S106 is performed to implant oxygen ions into the NMOS isolation region through the sacrificed oxide layer by using the second photoresist layer as a mask.

The oxygen ions implanted into the NMOS isolation region are used to react with the semiconductor substrate to produce silicon oxide. The implantation energy of oxygen ions is 50 KeV~400 KeV, and the implantation dose of oxygen ions is $10^{15}/cm^3 \sim 10^{22}/cm^3$.

A step S107 is performed to remove the second photoresist layer and the sacrificed oxide layer.

The portion of the second photoresist layer is removed by a known ashing process, and then the remaining second photoresist layer and the sacrificed oxide layer are removed by a wet etching process, wherein the etching solution used is a mixture solution of sulfuric acid and hydrofluoric acid.

A step S108 is performed to anneal the semiconductor substrate to form the isolation structures of PMOS and NMOS.

In the embodiment, the annealing process is performed so that the implanted nitrogen and oxygen ions are uniformly distributed into the semiconductor substrate. The annealing is performed at a temperature of 700° C.~1300° C. for 60 min~210 min.

Figure 7:
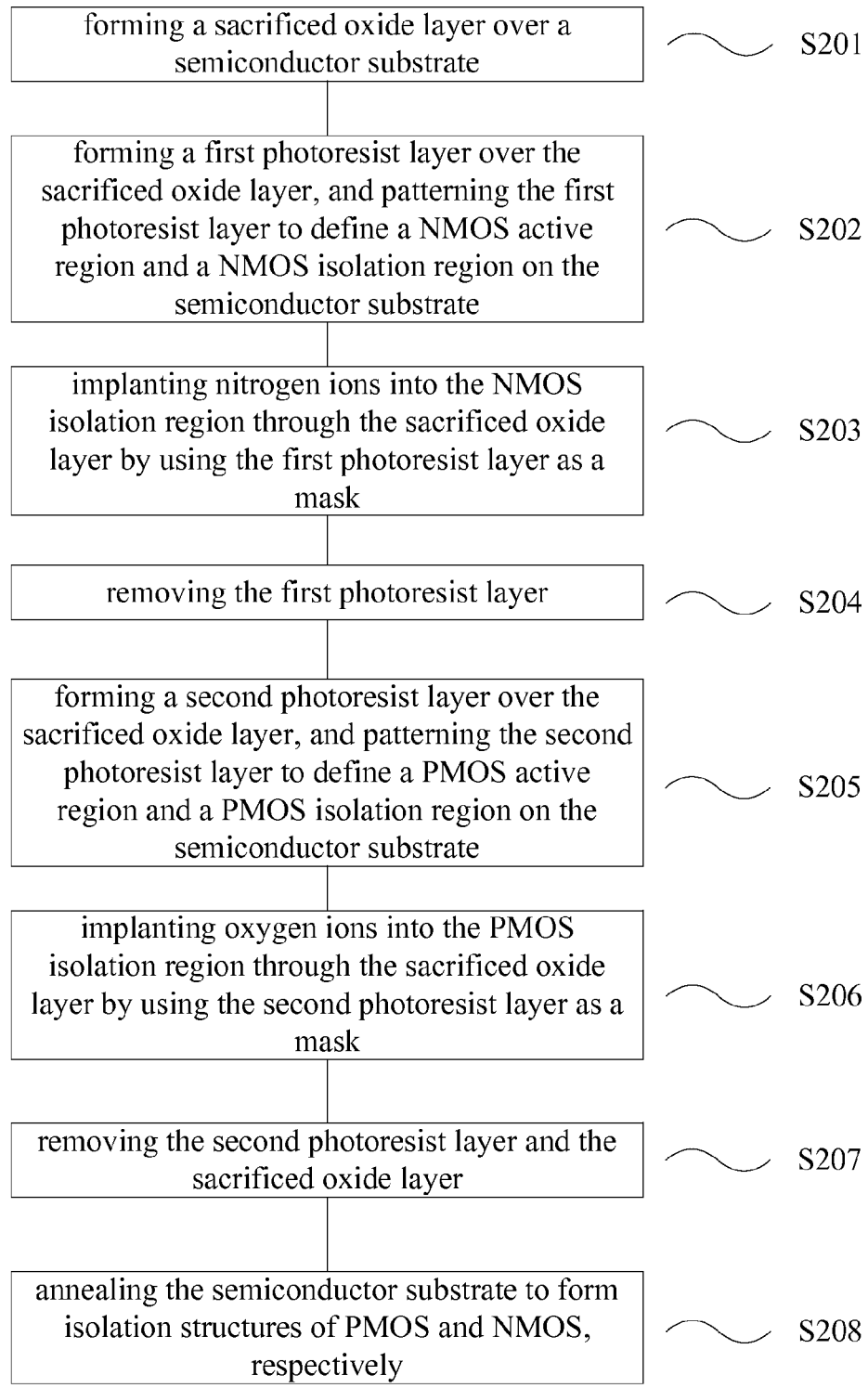
FIG. 7 is a flow chart illustrating a method for forming an isolation structure for MOS transistor according to a second embodiment of the present invention.

FIG. 7 is a flow chart illustrating a method for forming an isolation structure for MOS transistor according to a second embodiment of the present invention. As shown in FIG. 7, a step S201 is performed to form a sacrificed oxide layer over a semiconductor substrate.

A step S202 is performed to form a first photoresist layer over the sacrificed oxide layer, and pattern the first photoresist layer so as to define a NMOS active region and a NMOS isolation region on the semiconductor substrate.

A step S203 is performed to implant oxygen ions into the NMOS isolation region through the sacrificed oxide layer by using the first photoresist layer as a mask.

A step S204 is performed to remove the first photoresist layer.

A step S205 is performed to form a second photoresist layer over the sacrificed oxide layer, and pattern the second photoresist layer so as to define a PMOS active region and a PMOS isolation region on the semiconductor substrate.

A step S206 is performed to implant nitrogen ions into the PMOS isolation region through the sacrificed oxide layer by using the second photoresist layer as a mask.

A step S207 is performed to remove the second photoresist layer and the sacrificed oxide layer.

A step S208 is performed to anneal the semiconductor substrate to form the isolation structures of PMOS and NMOS.

Figure 8:
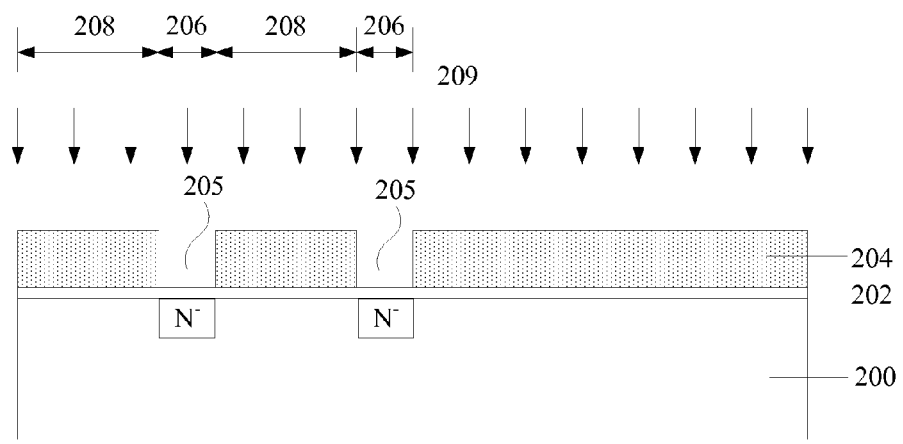
FIGS. 8 to 11 illustrate schematic views of a method for forming a MOS transistor comprising an isolation structure according to an embodiment of the present invention.

FIGS. 8 to 11 are schematic views illustrating a method for forming a MOS transistor comprising an isolation structure according to an embodiment of the present invention. Referring to FIG. 8, there is provided a semiconductor substrate 200, and a sacrificed oxide layer 202 is formed over the semiconductor substrate 200. Then a first photoresist layer 204 is formed over the sacrificed oxide layer 202 by a spin coating process, and a first open 205 is formed on the first photoresist layer 204 by using an exposure and developing treatment, wherein the position of the first open 205 corresponds to the portion of the semiconductor substrate 200 in which the PMOS isolation region will be formed. Therefore, the first open 205 separates the semiconductor substrate 200 into a PMOS isolation region 206 and a PMOS active region 208 disposed between two PMOS isolation regions 206. The nitrogen ions 209 are implanted into the PMOS isolation region 206 through the sacrificed oxide layer 202 by using the first photoresist layer 204 as a mask. The first photoresist layer 204 is disposed on the PMOS active region 208 for preventing nitrogen ions 209 from implanting into the PMOS active region 208.

In the embodiment, the sacrificed oxide layer 202 is preferably made of silicon dioxide ($SiO_2$) generally formed by a thermal oxidation process. For example, a sacrificed oxide layer 202 having a thickness of 50 Å~500 Å is formed by a thermal oxidation process at a temperature ranging from 1000° C. to 1400° C., preferably the thickness of the sacrificed oxide layer 202 is 100 Å~150 Å. Besides in this embodiment, the sacrificed oxide layer 202 also can be made of silicon oxynitride layer generally formed by a low pressure chemical vapor deposition process or plasma-assisted chemical vapor deposition process, the resultant sacrificed oxide layer 202 also has a thickness of 50 Å~500 Å.

In a fabrication process for the deep submicron to nanoscale device, depending on the requirement for designing the isolation structure, the implantation depth and density of nitrogen ions 209 can be controlled by adjusting the implantation dose and energy of nitrogen ions 209. The depth and density of nitrogen ions 209 implanted into the PMOS isolation region 206 in the semiconductor substrate 200 can be controlled by controlling the implantation dose and energy of nitrogen ions 209. The accelerating energy of nitrogen ions 209 can be more than 100 KeV, or 50~100 KeV, or 10~50 KeV, or below 10 KeV The higher the energy is, the lower the dose used is, and vice versa. In the present invention, the implantation energy of nitrogen ions 209 is 50 KeV~400 KeV, specifically, 50 KeV, 100 KeV, 200 KeV, 300 KeV or 400 KeV and so on, preferably 200 KeV The implantation dose of nitrogen ions 209 is $10^{15}/cm^3$~$10^{22}/cm^3$, specifically, for example, $10^{15}/cm^3$, $10^{16}/cm^3$, $10^{17}/cm^3$, $10^{18}/cm^3$, $10^{19}/cm^3$, $10^{20}/cm^3$, $10^{21}/cm^3$, or $10^{22}/cm^3$, preferably $10^{19}/cm^3$.

Further, in order to make the density of nitrogen ions 209 at different implanting depth more uniform in the PMOS isolation region 206 in the semiconductor substrate 200, the implantation of nitrogen ions 209 can be performed more times, preferably 2~4 times, more preferably 3 times. When the implantation of nitrogen ions 209 is performed more times, the implantation dose and energy of nitrogen ions 209 can be adjusted appropriately during each implantation, for example, gradually increasing or decreasing the implantation dose and energy of nitrogen ions 209. And of course, the implantation dose and energy of nitrogen ions 209 can also arbitrarily increase or decrease.

When the implantation of nitrogen ions 209 is performed more times, the process parameters are the same as those described above. That is, the implantation energy of nitrogen ions 209 is 50 KeV~400 KeV, preferably 200 KeV The implantation dose of nitrogen ions 209 is $10^{15}/cm^3$~$10^{22}/cm^3$, preferably $10^{19}/cm^3$. The depth of nitrogen ions 209 implanted ranges from 250 nm to 450 nm, specifically, e.g., 250 nm, 300 nm, 350 nm, 400 nm or 450 nm or so on.

Figure 9:
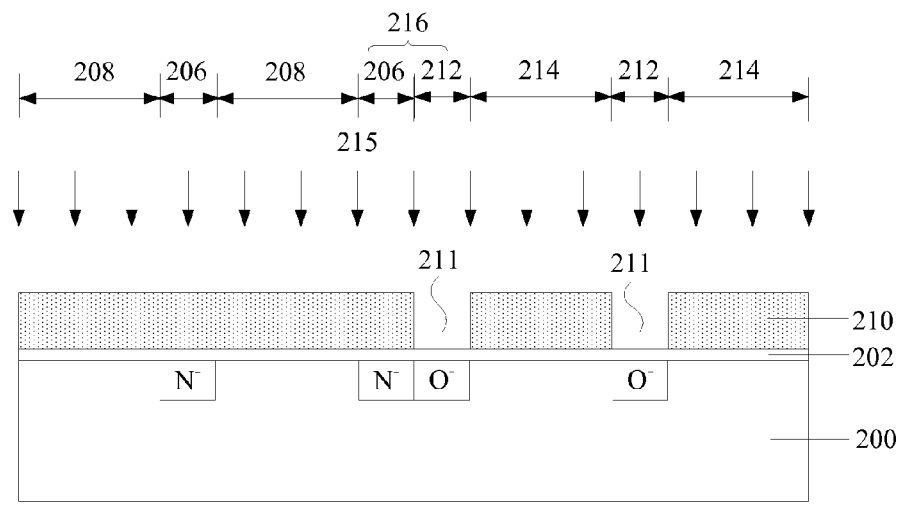

Referring to FIG. 9, the first photoresist layer 204 is removed by a conventional technique such as an ashing process as known by those skilled in the art. Then, a second photoresist layer 210 is formed on the sacrificed oxide layer 202 by a spin coating process, and a second open 211 is formed on the second photoresist layer 210 by using an exposure and developing treatment, wherein the position of the second open 211 corresponds to the portion of the semiconductor substrate 200 in which a NMOS isolation region will be formed. Therefore, the second open 211 separates the semiconductor substrate 200 into a NMOS isolation region 212 and a NMOS active region 214 disposed between two NMOS isolation regions 212. The oxygen ions 215 are implanted into the NMOS isolation region 212 through the sacrificed oxide layer 202 by using the second photoresist layer 210 as a mask. The second photoresist layer 210 is disposed on the NMOS active region 214 for preventing oxygen ions 215 from implanting into the NMOS active region 214, wherein the NMOS isolation region 212 and adjacent PMOS isolation region 206 partially overlap between each other to form a buffer isolation region 216.

In this embodiment, the partially overlapped region between the NMOS isolation region and the PMOS isolation region has a cross-section area along the width direction of the active region of 0%~30% relate to the total cross-section area of the NMOS and PMOS isolation regions along the width direction of the active region, for example 0%, 10%, 20%, 30% and so on. If the cross-section area is more than 30% of the total area, it is possible that the tensile stress in the PMOS isolation region 206 within the buffer isolation region 216 has an effect on the NMOS active region 214, which may increase the compressive stress in the NMOS active region 214 and reduce the tensile stress in the NMOS active region 214, and thereby affect the migration of electron. Similarly, the compressive stress in the NMOS isolation region 212 within the buffer isolation region 216 has an effect on the PMOS active region 208, which may increase the tensile stress in the PMOS active region 208 and reduce the compressive stress in the PMOS active region 208, and thereby affect the migration of hole.

The depth and density of oxygen ions 215 implanted can be controlled by adjusting the implantation dose and energy of oxygen ions 215. The depth and density of oxygen ions 215 implanted into the NMOS isolation region 212 in the semiconductor substrate 200 can be controlled by controlling the implantation dose and energy of oxygen ions 215. The accelerating energy of oxygen ions 215 can be more than 100 KeV, or 50~100 KeV, or 10~50 KeV, or below 10 KeV. The higher the energy is, the lower the dose used is, and vice versa. In the present invention, the implantation energy of oxygen ions 215 is 50 KeV~400 KeV, specifically, 50 KeV, 100 KeV, 200 KeV, 300 KeV or 400 KeV and so on, preferably 200 KeV The implantation dose of oxygen ions 215 is $10^{15}/cm^3 \sim 10^{22}/cm^3$, specifically, for example, $10^{15}/cm^3$, $10^{16}/cm^3$, $10^{17}/cm^3$, $10^{18}/cm^3$, $10^{19}/cm^3$, $10^{20}/cm^3$, $10^{21}/cm^3$, or $10^{22}/cm^3$, preferably $10^{19}/cm^3$.

Further, in order to make the density of oxygen ions 215 at different implanting depth more uniform in the NMOS isolation region 212 in the semiconductor substrate 200, the implantation of oxygen ions 215 can be performed more times, preferably 2~4 times, more preferably 3 times. When the implantation of oxygen ions 215 is performed more times, the implantation dose and energy of oxygen ions 215 can be adjusted appropriately during each implantation, for example, gradually increasing or decreasing the implantation dose and energy of oxygen ions 215. And of course, the implantation dose and energy of oxygen ions 215 can also arbitrarily increase or decrease.

When the implantation of oxygen ions 215 is performed more times, the process parameters are the same as those described above. That is, the implantation energy of oxygen ions 215 is 50 KeV~400 KeV, preferably 200 KeV The implantation dose of oxygen ions 215 is $10^{15}/cm^3 \sim 10^{22}/cm^3$, preferably $10^{19}/cm^3$. The implantation depth of oxygen ions 215 ranges from 250 nm to 450 nm, such as 250 nm, 300 nm, 350 nm, 400 nm or 450 nm and so on.

Alternatively, the NMOS isolation region 212 and the NMOS active region 214 can also be defined firstly, and then oxygen ions 215 are implanted into the NMOS isolation region 212. Subsequently the PMOS isolation region 206 and the PMOS active region 208 are defined, followed by implanting nitrogen ions 209 into the PMOS isolation region 206.

Figure 10:
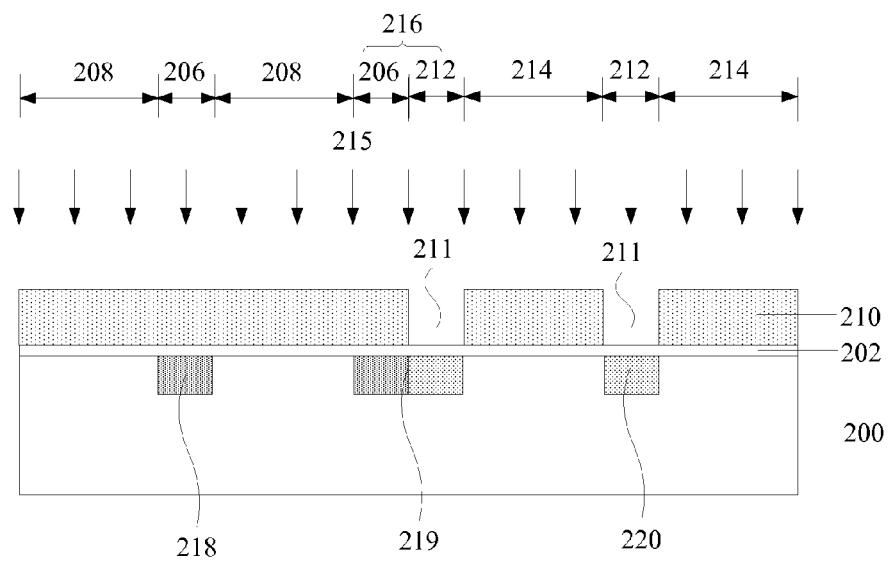

As shown in FIG. 10, a PMOS isolation structure 218 is formed by annealing the semiconductor substrate 200 to diffuse nitrogen ions contained in the PMOS isolation region 206 into the semiconductor substrate 200. In the meantime, a NMOS isolation structure 220 is formed by diffusing oxygen ions contained in the NMOS isolation region 212 into the semiconductor substrate 200. A buffer isolation structure 219 is formed at the buffer isolation region 216. A tensile stress is generated in the PMOS isolation structure 218 by nitrogen ions implanted into the PMOS isolation region 206. And a compressive stress is generated in the NMOS isolation structure 220 by oxygen ions implanted into the NMOS isolation region 212.

The annealing temperature is in a range of 700° C.~1300° C., such as 700° C., 800° C., 900° C., 1000° C., 1100° C., 1200° C. or 1300° C.; and the annealing time is in a range of 60 min~210 min, such as 60 min, 80 min, 100 min, 120 min, 140 min, 160 min, 180 min, 200 min or 210 min. The annealing process can be any conventional process in the art, including furnace annealing, rapid thermal annealing (RTA), laser annealing, etc., preferably furnace anneal.

During the annealing process for the semiconductor substrate, nitrogen ions diffuse into the silicon crystal in the semiconductor substrate and combine with the silicon crystal to form an isolation nitride such as silicon nitride; and oxygen ions diffuse into the silicon crystal in the semiconductor substrate and combine with the silicon crystal to form an isolation oxide such as silicon oxide.

Alternatively, it can be achieved by two annealing processes. One is performed after implanting nitrogen ions into the semiconductor substrate and the other is performed after implanting oxygen ions into the semiconductor substrate.

Figure 11:
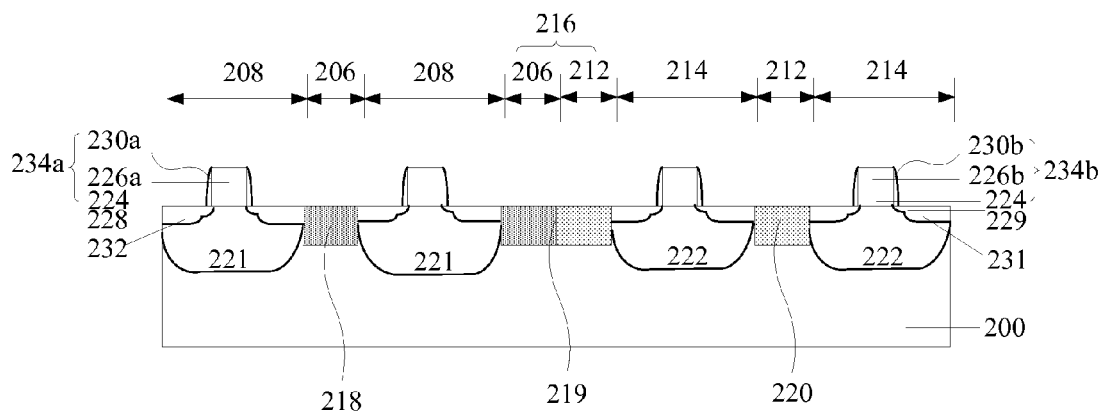

As shown in FIG. 11, the second photoresist layer 210 and the sacrificed oxide layer 202 are removed by a conventional technique such as ashing process as known by those skilled in the art. Any conventional technique as known by those skilled in the art can be employed to remove the sacrificed oxide layer 202. In a specific embodiment of the invention, the sacrificed oxide layer 202 is removed by a wet etching process, for example, using hydrogen fluoride (HF) solution comprising a buffer agent such as ammonium fluoride, so that the damage to the semiconductor substrate 200 can be as small as possible during removing the sacrificed oxide layer 202.

n-type ions are doped into the PMOS active region 208 to form a n-well 221, and p-type ions are doped into the NMOS active region 214 to form a p-well 222. A gate dielectric layer 224 is formed on the PMOS active region 208 and the NMOS active region 214 by an oxidation process. A polycrystalline silicon layer is formed on the gate dielectric layer 224 by a CVD process. The polycrystalline silicon layer and the gate dielectric layer are etched until the semiconductor substrate 200 is exposed, and gates 226a and 226b are formed on the PMOS active region 208 and the NMOS active region 214. p-type ions are implanted into the semiconductor substrate 200 on the both sides of the gate 226a of the PMOS active region 208 to form a p-type low doped drain 228. n-type ions are implanted into the semiconductor substrate 200 on the both sides of the gate 226b of the NMOS active region 214 to form a n-type low doped drain 229. Spacers 230a and 230b are formed on the sidewalls of the gates 226a and 226b, thereby forming gate structures 234a and 234b. p-type ions are implanted into the semiconductor substrate 200 on the both sides of the gate structure 234a of PMOS active region 208 to form a p-type source/drain 232, and n-type ions are implanted into the semiconductor substrate 200 on the both sides of the gate structure 234b of the NMOS active region 214 to form a n-type source/drain 231.

Further referring to FIG. 11, an isolation structure for MOS transistor provided by the present invention comprises a semiconductor substrate 200; a PMOS active region 208 and a NMOS active region 214 formed on the semiconductor substrate 200; a PMOS isolation region 206 disposed between the PMOS active regions 208, into which nitrogen ions are implanted which will form a PMOS isolation structure 218 after annealing; a NMOS isolation region 212 disposed between the NMOS active regions 214, into which oxygen ions are implanted which will form a NMOS isolation structure 219 after annealing; a buffer isolation region 216 between the PMOS active region 208 and the adjacent NMOS active region 214, into which oxygen and nitrogen ions are implanted to form a buffer isolation structure 220; a gate structure 234a over the PMOS active region 208 in the semiconductor substrate 200, which comprises a gate dielectric layer 224, gates 226a on the gate dielectric layer 224, and spacers 230a on the both sides of the gate 226a; a n-type low doped drain 228 and a n-type source/drain 232 on the both sides of the gate structure 234a in the semiconductor substrate 200; a gate structure 234b over the NMOS active region 218 in the semiconductor substrate 200, which comprises a gate dielectric layer 224, gates 226b on the gate dielectric layer 224, and spacers 230b on the both sides of the gate 226b;

and a p-type low doped drain 229 and a p-type source/drain 231 on the both sides of the gate structure 234b in the semiconductor substrate 200.

While the present invention has been described with respect to the preferable embodiments, it will be apparent to those skilled in the art that various changes and modifications may be made without departing from the spirit and scope of the invention as defined in the following claims.

What is claimed is:

1. A method for forming an isolation structure for a MOS transistor, comprising the following steps:
    forming a sacrificed oxide layer over a semiconductor substrate;
    forming a first photoresist layer over the sacrificed oxide layer, and patterning the first photoresist layer to define a PMOS active region and a PMOS isolation region on the semiconductor substrate;
    implanting nitrogen ions into the PMOS isolation region through the sacrificed oxide layer by using the first photoresist layer as a mask;
    removing the first photoresist layer;
    forming a second photoresist layer over the sacrificed oxide layer, and patterning the second photoresist layer to define an NMOS active region and an NMOS isolation region on the semiconductor substrate;
    implanting oxygen ions into the NMOS isolation region through the sacrificed oxide layer by using the second photoresist layer as a mask;
    removing the second photoresist layer and the sacrificed oxide layer; and
    annealing the semiconductor substrate to form isolation structures of PMOS and NMOS, respectively.

2. The method for forming an isolation structure for a MOS transistor according to claim 1, wherein as the NMOS active region and the NMOS isolation region are defined, the NMOS isolation region and adjacent PMOS isolation region partially overlap between each other to form a buffer isolation region; and as the isolation structures of PMOS and NMOS are formed, a buffer isolation structure is formed.

3. The method for forming an isolation structure for a MOS transistor according to claim 2, wherein the partially overlapped region between the NMOS isolation region and the PMOS isolation region has a cross-section area along the width direction of the active region of 0%~30% relate to the total cross-section area of the NMOS and PMOS isolation regions along the width direction of the active region.

4. The method for forming an isolation structure for a MOS transistor according to claim 1, wherein the implantation energy of nitrogen ions is in a range of 50 KeV~400 KeV.

5. The method for forming an isolation structure for a MOS transistor according to claim 4, wherein the implantation dose of nitrogen ions is in a range of $10^{15}/cm^3$~$10^{22}/cm^3$.

6. The method for forming an isolation structure for a MOS transistor according to claim 1, wherein the implantation energy of oxygen ions is in a range of 50 KeV~400 KeV.

7. The method for forming an isolation structure for a MOS transistor according to claim 6, wherein the implantation dose of oxygen ions is in a range of $10^{15}/cm^3$~$10^{22}/cm^3$.

8. The method for forming an isolation structure for a MOS transistor according to claim 1, wherein the annealing is performed under a temperature of 700° C. ~1300° C.

9. The method for forming an isolation structure for a MOS transistor according to claim 8, wherein the annealing is performed for 60 min~210 min.

10. A method for forming an isolation structure for a MOS transistor, comprising the following steps:
    forming a sacrificed oxide layer over a semiconductor substrate;
    forming a first photoresist layer over the sacrificed oxide layer, and patterning the first photoresist layer to define an NMOS active region and an NMOS isolation region on the semiconductor substrate;
    implanting oxygen ions into the NMOS isolation region through the sacrificed oxide layer by using the first photoresist layer as a mask;
    removing the first photoresist layer;
    forming a second photoresist layer over the sacrificed oxide layer, and patterning the second photoresist layer to define a PMOS active region and a PMOS isolation region on the semiconductor substrate;
    implanting nitrogen ions into the PMOS isolation region through the sacrificed oxide layer by using the second photoresist layer as a mask;
    removing the second photoresist layer and the sacrificed oxide layer; and
    annealing the semiconductor substrate to form isolation structures of PMOS and NMOS, respectively.

11. The method for forming an isolation structure for MOS transistor according to claim 10, wherein as the PMOS active region and the PMOS isolation region are defined, the NMOS isolation region and adjacent PMOS isolation region partially overlap between each other to form a buffer isolation region; and as the isolation structures of PMOS and NMOS are formed, a buffer isolation structure is formed.

12. The method for forming an isolation structure for MOS transistor according to claim 11, wherein the partially overlapped region between the NMOS isolation region and the PMOS isolation region has a cross-section area along the width direction of the active region of 0%~30% relate to the total cross-section area of the NMOS and PMOS isolation regions along the width direction of the active region.

* * * * *